(12) United States Patent
Iwai

(10) Patent No.: US 11,658,100 B2
(45) Date of Patent: *May 23, 2023

(54) PACKAGING OF A SEMICONDUCTOR DEVICE WITH A PLURALITY OF LEADS

(71) Applicant: ROHM CO., LTD., Kyoto (JP)

(72) Inventor: Katsuhiro Iwai, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/472,362

(22) Filed: Sep. 10, 2021

(65) Prior Publication Data

US 2021/0407893 A1    Dec. 30, 2021

Related U.S. Application Data

(63) Continuation of application No. 17/109,675, filed on Dec. 2, 2020, now Pat. No. 11,183,444, which is a
(Continued)

(30) Foreign Application Priority Data

Jan. 27, 2016    (JP) .................................. 2016-013368

(51) Int. Cl.
*H01L 23/495* (2006.01)
*H01L 23/31* (2006.01)
*H01L 23/00* (2006.01)

(52) U.S. Cl.
CPC .... *H01L 23/49548* (2013.01); *H01L 23/3107* (2013.01); *H01L 23/3121* (2013.01);
(Continued)

(58) Field of Classification Search
CPC ........... H01L 23/3107; H01L 23/49541; H01L 23/49548; H01L 23/49582; H01L 23/562;
(Continued)

(56) References Cited

U.S. PATENT DOCUMENTS 6,165,819 A    12/2000  Seki et al.
11,183,444 B2 *  11/2021  Iwai .................... H01L 23/4952
(Continued)

FOREIGN PATENT DOCUMENTS

JP    11-103003 A    4/1999
JP    2006-73570 A    3/2006
(Continued)

OTHER PUBLICATIONS

Office Action received in the corresponding Japanese Patent application, dated Sep. 3, 2019, and corresponding machine translation (17 pages).

*Primary Examiner* — Wasiul Haider
(74) *Attorney, Agent, or Firm* — Hamre, Schumann, Mueller & Larson, P.C.

(57) ABSTRACT

A semiconductor device includes a plurality of leads, a semiconductor element electrically connected to the leads and supported by one of the leads, and a sealing resin covering the semiconductor element and a part of each lead. The sealing resin includes a first edge, a second edge perpendicular to the first edge, and a center line parallel to the first edge. The reverse surfaces of the respective leads include parts exposed from the sealing resin, and the exposed parts include an outer reverse-surface mount portion and an inner reverse-surface mount portion that are disposed along the second edge of the sealing resin. The inner reverse-surface mount portion is closer to the center line of the sealing resin than is the outer reverse-surface mount portion. The outer reverse-surface mount portion is greater in area than the inner reverse-surface mount portion.

20 Claims, 16 Drawing Sheets

Related U.S. Application Data continuation of application No. 16/242,227, filed on Jan. 8, 2019, now Pat. No. 10,886,203, which is a continuation of application No. 15/416,261, filed on Jan. 26, 2017, now Pat. No. 10,211,130.

(52) U.S. Cl.
CPC ...... *H01L 23/3142* (2013.01); *H01L 23/4952* (2013.01); *H01L 23/49541* (2013.01); *H01L 23/49551* (2013.01); *H01L 23/49582* (2013.01); *H01L 23/562* (2013.01); *H01L 24/06* (2013.01); *H01L 24/32* (2013.01); *H01L 24/48* (2013.01); *H01L 24/49* (2013.01); *H01L 24/73* (2013.01); *H01L 2224/04026* (2013.01); *H01L 2224/04042* (2013.01); *H01L 2224/0603* (2013.01); *H01L 2224/06181* (2013.01); *H01L 2224/32245* (2013.01); *H01L 2224/48247* (2013.01); *H01L 2224/48465* (2013.01); *H01L 2224/49111* (2013.01); *H01L 2224/49113* (2013.01); *H01L 2224/49431* (2013.01); *H01L 2224/73265* (2013.01); *H01L 2924/00014* (2013.01); *H01L 2924/181* (2013.01); *H01L 2924/18301* (2013.01); *H01L 2924/3512* (2013.01)

(58) Field of Classification Search
CPC ............. H01L 23/3121; H01L 23/4952; H01L 2924/181; H01L 2224/48465; H01L 2224/0603; H01L 2224/48247; H01L 2224/49111; H01L 2224/73265; H01L 2224/32245

See application file for complete search history.

(56) References Cited

U.S. PATENT DOCUMENTS

| | | |
|---|---|---|
| 2002/0084518 A1 | 7/2002 | Hasebe et al. |
| 2006/0017141 A1 | 1/2006 | Luo et al. |
| 2010/0164078 A1 | 7/2010 | Madrid et al. |
| 2010/0181628 A1* | 7/2010 | Kawano ................. H01L 24/85 |
| | | 257/692 |
| 2011/0081750 A1 | 4/2011 | Machida |
| 2014/0103510 A1 | 4/2014 | Andou |
| 2014/0117403 A1 | 5/2014 | Hayashi |
| 2014/0327121 A1 | 11/2014 | Yamaguchi et al. |
| 2016/0079147 A1* | 3/2016 | Shimada ........... H01L 23/49555 |
| | | 257/675 |
| 2017/0141065 A1 | 5/2017 | Murai et al. |
| 2017/0207306 A1* | 7/2017 | Otremba ........... H01L 23/49541 |

FOREIGN PATENT DOCUMENTS

| | | |
|---|---|---|
| JP | 2007-48911 A | 2/2007 |
| JP | 2008-227531 A | 9/2008 |
| JP | 2009-71033 A | 4/2009 |
| JP | 2009-272525 A | 11/2009 |
| JP | 2014-82385 A | 5/2014 |
| JP | 2016-62904 A | 4/2016 |
| WO | 2013/080759 A1 | 6/2013 |

* cited by examiner

PACKAGING OF A SEMICONDUCTOR DEVICE WITH A PLURALITY OF LEADS

BACKGROUND OF THE INVENTION

1. Field of the Invention

The present invention relates to a semiconductor device.

2. Description of the Related Art

For a semiconductor device including a semiconductor element, typified by a transistor, various configurations have been proposed. An example of a conventional semiconductor device is disclosed in JP-A-2009-71033. The semiconductor device disclosed in this document includes a semiconductor element, a plurality of leads and a sealing resin. The semiconductor element is supported on one of the plurality of leads and electrically connected to the leads. The sealing resin covers the semiconductor element and a part of each lead. The portions of the leads which are exposed from the sealing resin constitute mount portions, which are used for mounting the semiconductor device on e.g. a circuit board. The mount portions are bonded to a circuit board with solder, for example.

In accordance with the specifications of the semiconductor device or the use environment, stress may be generated in the solder for bonding the mount portions and the circuit board. The stress may undesirably cause the solder to crack or peel off.

SUMMARY OF THE INVENTION

The present invention has been proposed under the above circumstances, and an object thereof is to provide a semiconductor device that enhances the mounting strength.

According to an aspect of the invention, there is provided a semiconductor device provided with: a plurality of leads each including an obverse surface and a reverse surface that face away from each other in a thickness direction; a semiconductor element electrically connected to the plurality of leads and supported by the obverse surface of one of the plurality of leads; and a sealing resin covering the semiconductor element and a part of each of the leads. The sealing resin includes a first edge, a second edge and a center line, where the first edge extends along a first direction perpendicular to the thickness direction, the second edge extends along a second direction perpendicular to both the thickness direction and the first direction, and the center line extends in parallel to the first edge. The reverse surfaces of the plurality of leads include a plurality of exposed parts exposed from the sealing resin, and the exposed parts include at least one outer reverse-surface mount portion and at least one inner reverse-surface mount portion that are arranged along the second edge of the sealing resin. The inner reverse-surface mount portion is closer to the center line of the sealing resin than is the outer reverse-surface mount portion, and the outer reverse-surface mount portion is greater in area than the inner reverse-surface mount portion.

With the above arrangements, the outer reverse-surface mount portion, having a relatively large area, can be disposed at the outermost position in the second direction. This feature is advantageous for preventing cracks or other defects from occurring at the mount portion due to large thermal stress.

Further features and advantages of the present invention will become apparent from the following detailed description with reference to the attached drawings.

DESCRIPTION OF THE PREFERRED EMBODIMENTS

Preferred embodiments of the present invention are described below with reference to the drawings.

FIGS. 1-13 show a semiconductor device according to a first embodiment of the present invention. The semiconductor device A1 of this embodiment includes a plurality of leads 1, 2 and 3, a semiconductor element 4, and a sealing resin 6.

Figure 1:
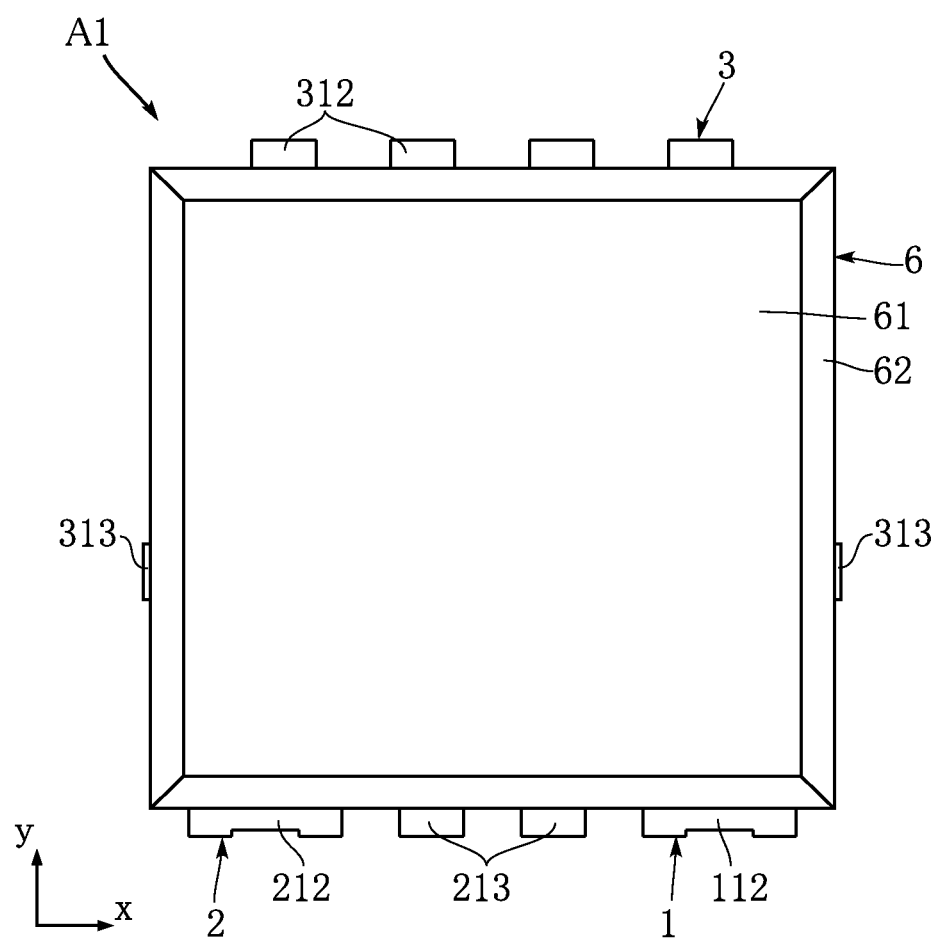
FIG. 1 is a plan view showing a semiconductor device according to a first embodiment of the present invention.
Figure 2:
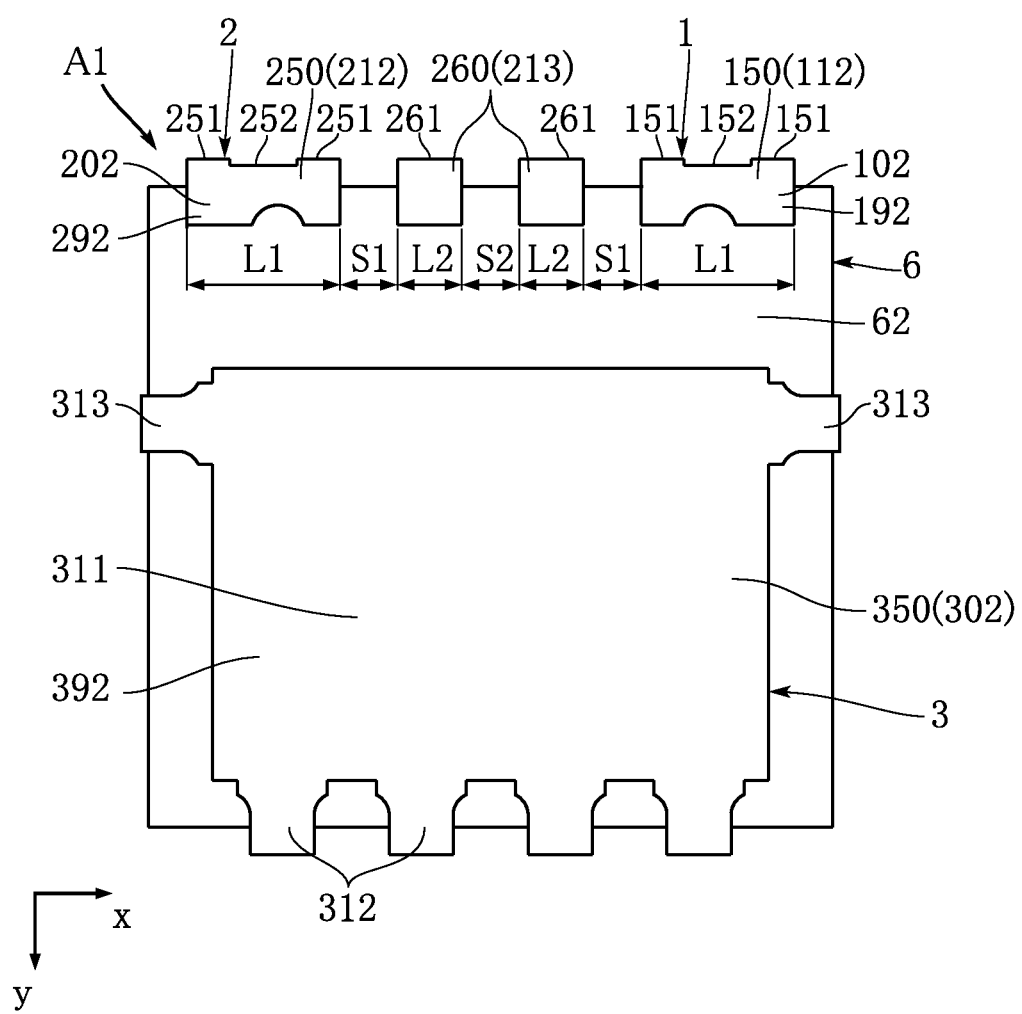
FIG. 2 is a bottom view showing the semiconductor device according to the first embodiment of the present invention.
Figure 3:
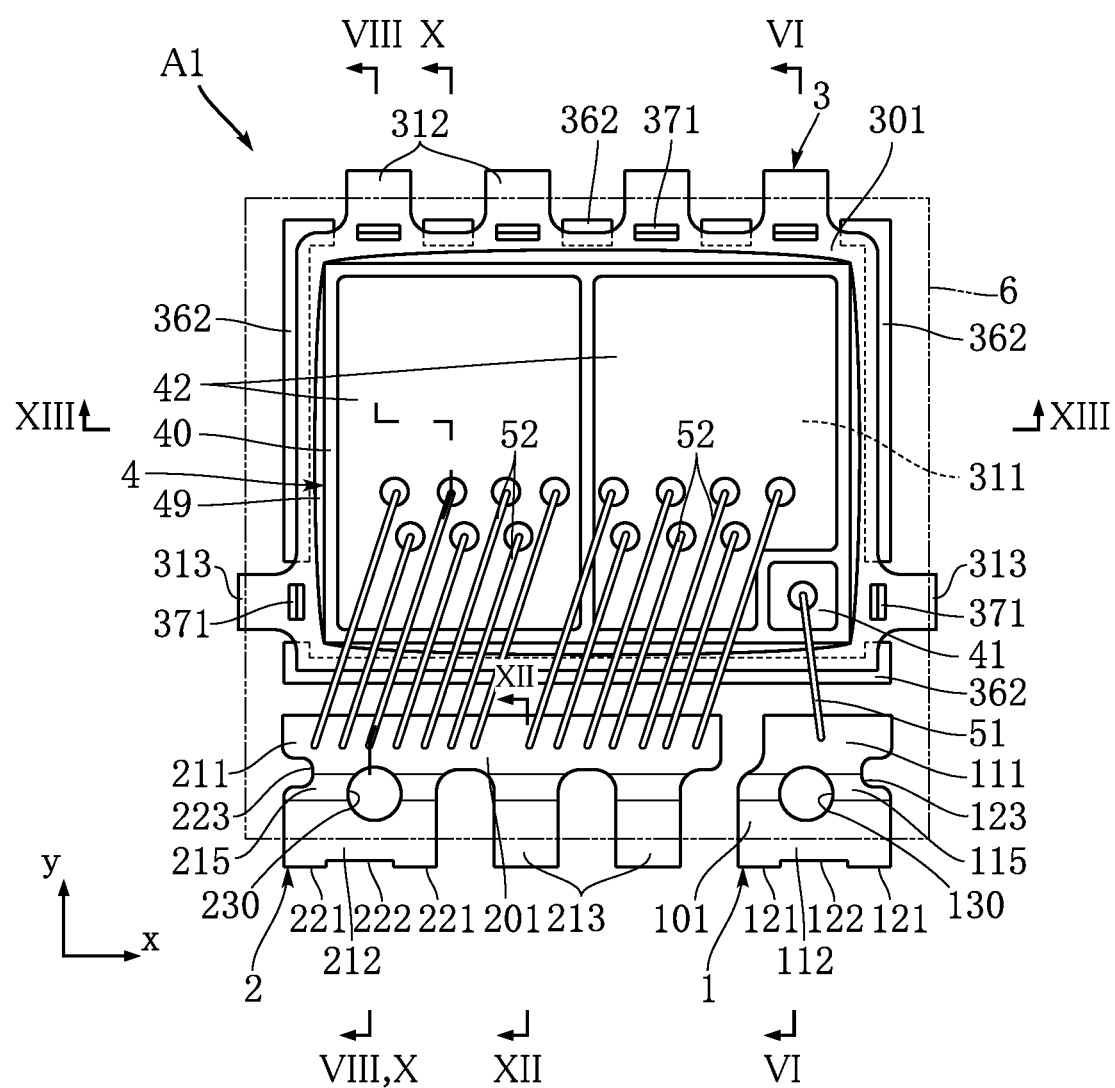
FIG. 3 is a plan view showing a main part of the semiconductor device according to the first embodiment of the present invention.
Figure 4:
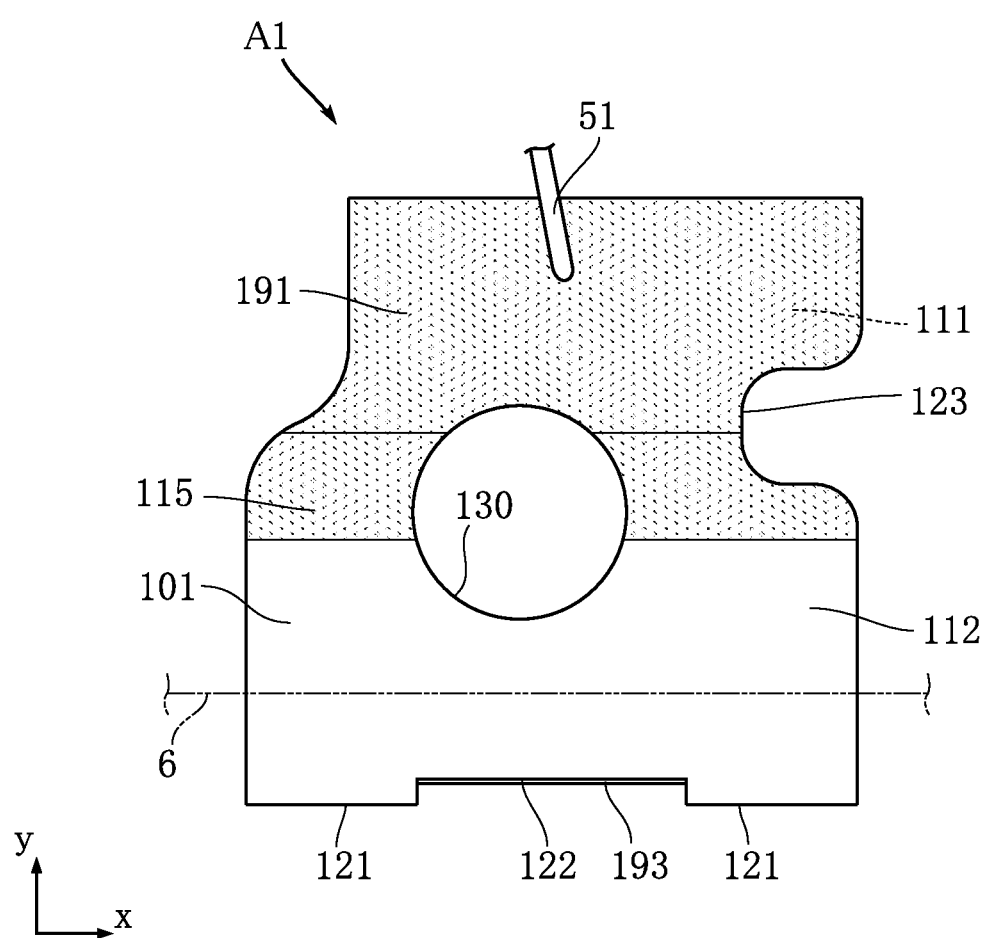
FIG. 4 is an enlarged plan view showing a main part of the semiconductor device according to the first embodiment of the present invention.
Figure 5:
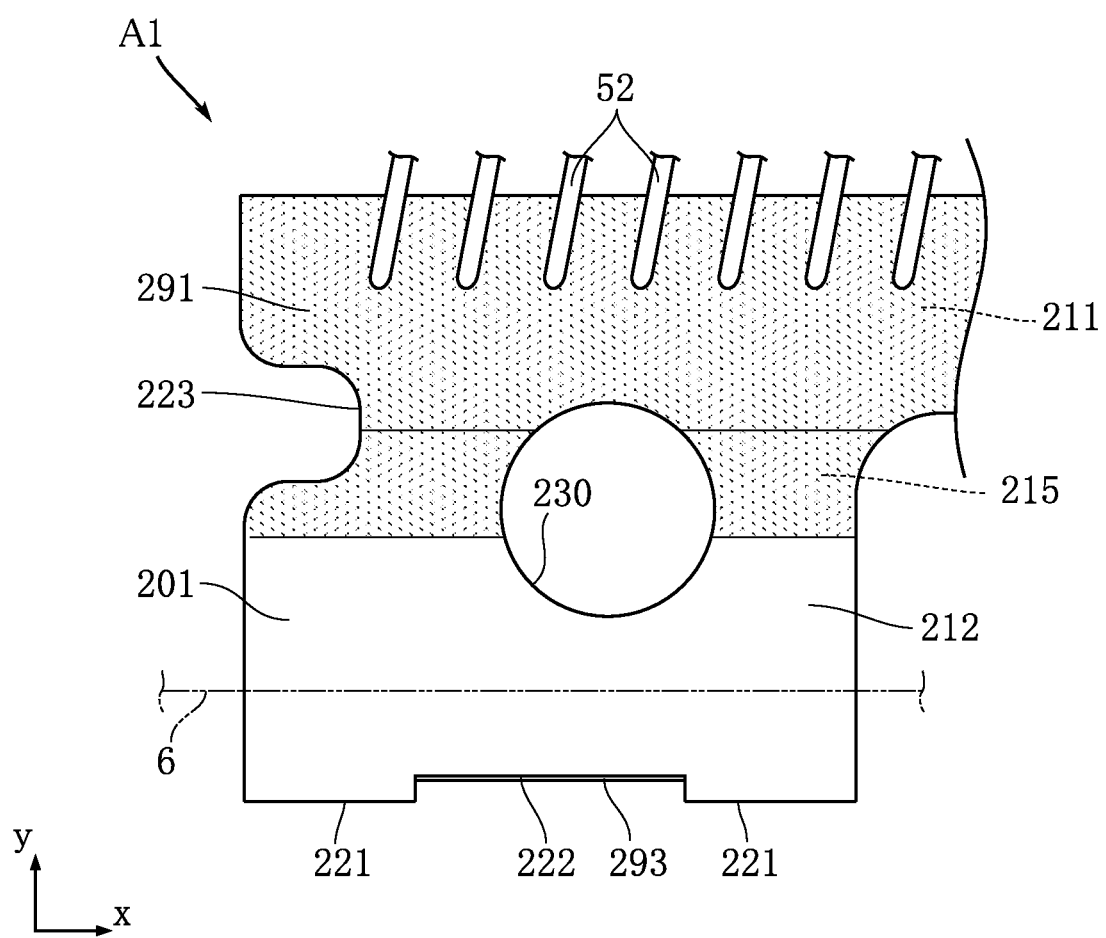
FIG. 5 is an enlarged plan view showing a main part of the semiconductor device according to the first embodiment of the present invention.
Figure 6:
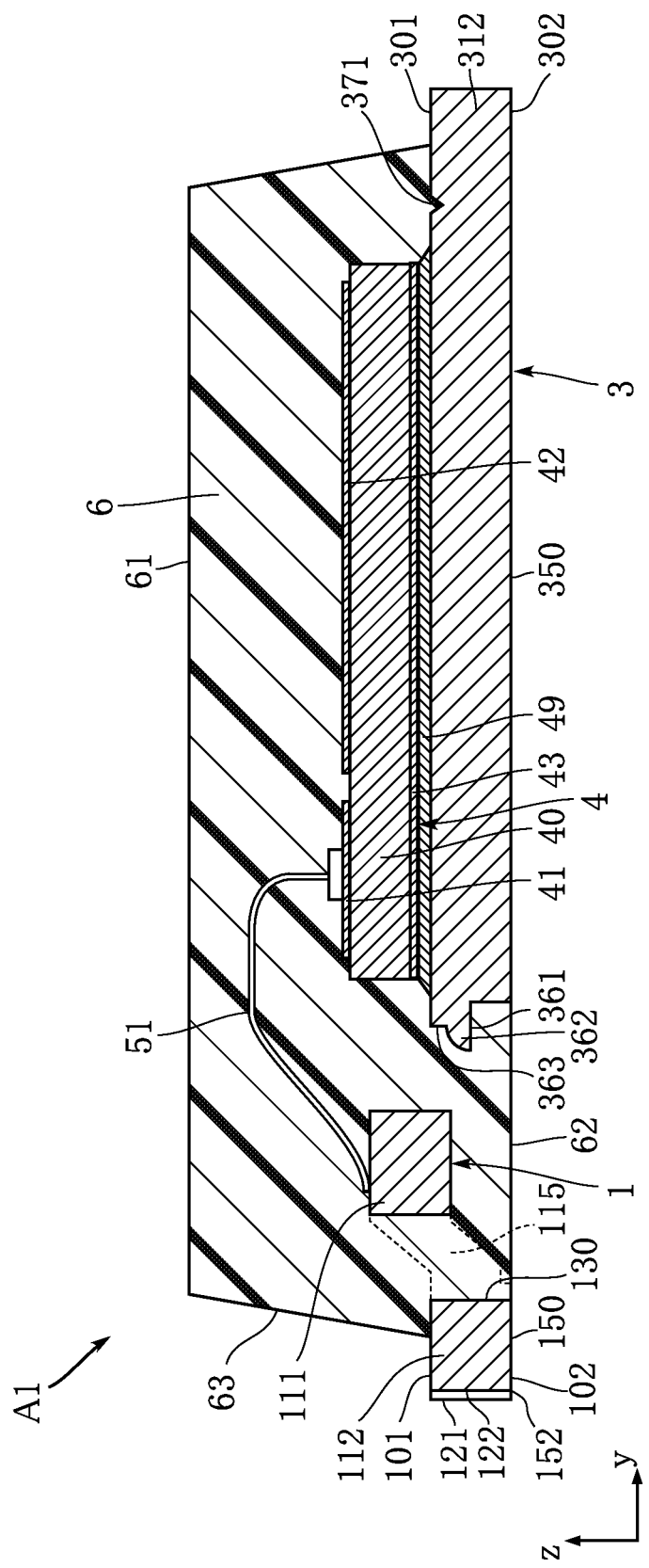
FIG. 6 is a sectional view taken along lines VI-VI in FIG. 3.
Figure 7:
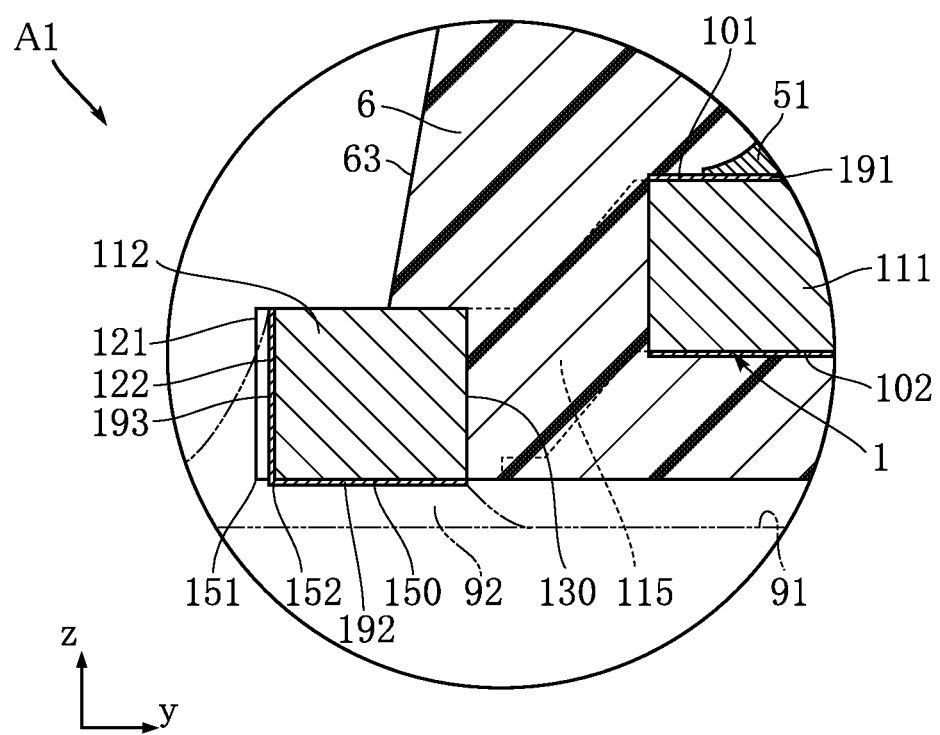
FIG. 7 is a sectional view taken along lines VI-VI in FIG. 3.
Figure 8:
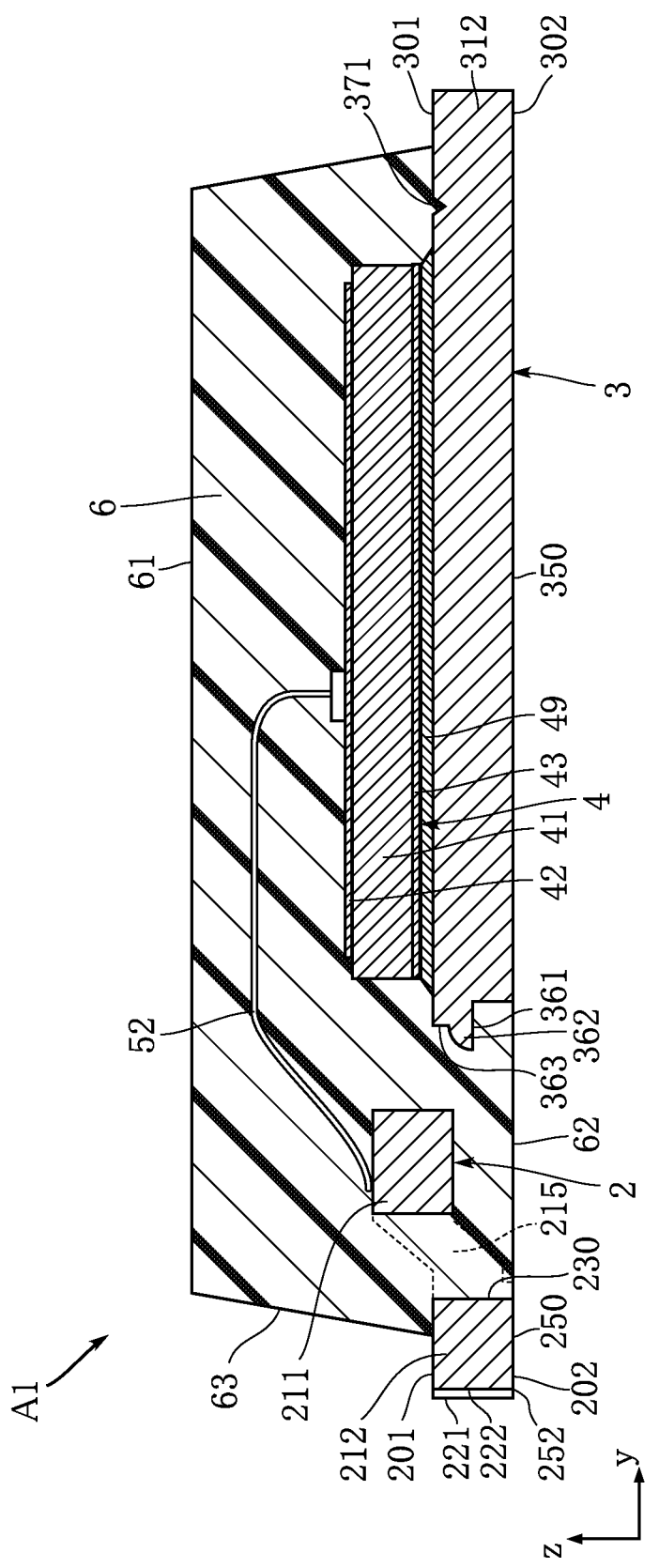
FIG. 8 is a sectional view taken along lines VIII-VIII in FIG. 3.
Figure 9:
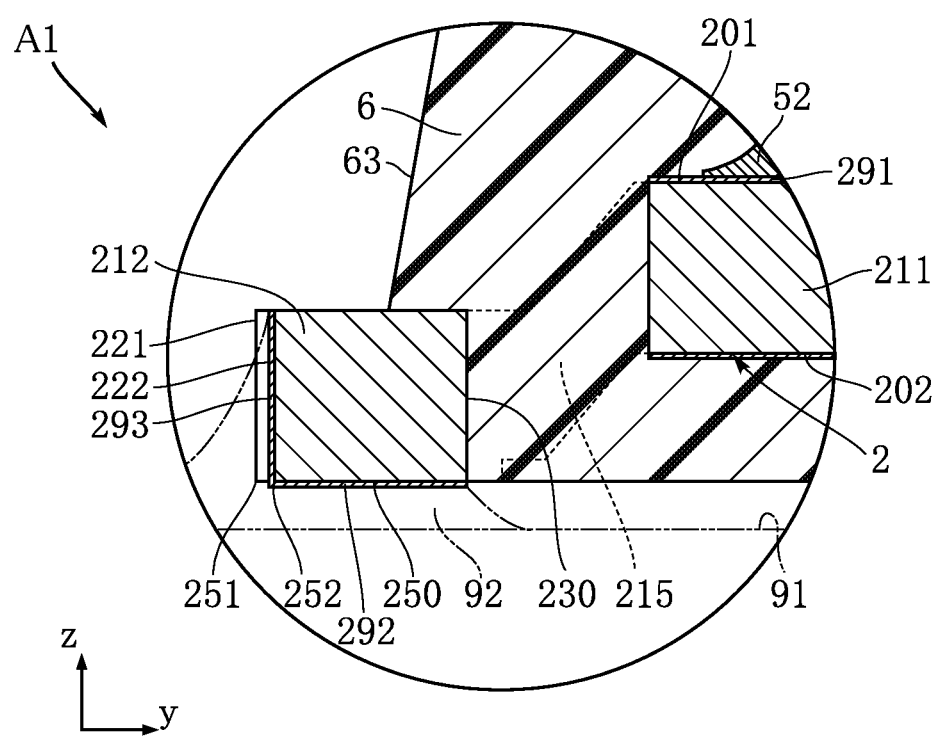
FIG. 9 is an enlarged sectional view of a main part, taken along lines VIII-VIII in FIG. 3.
Figure 10:
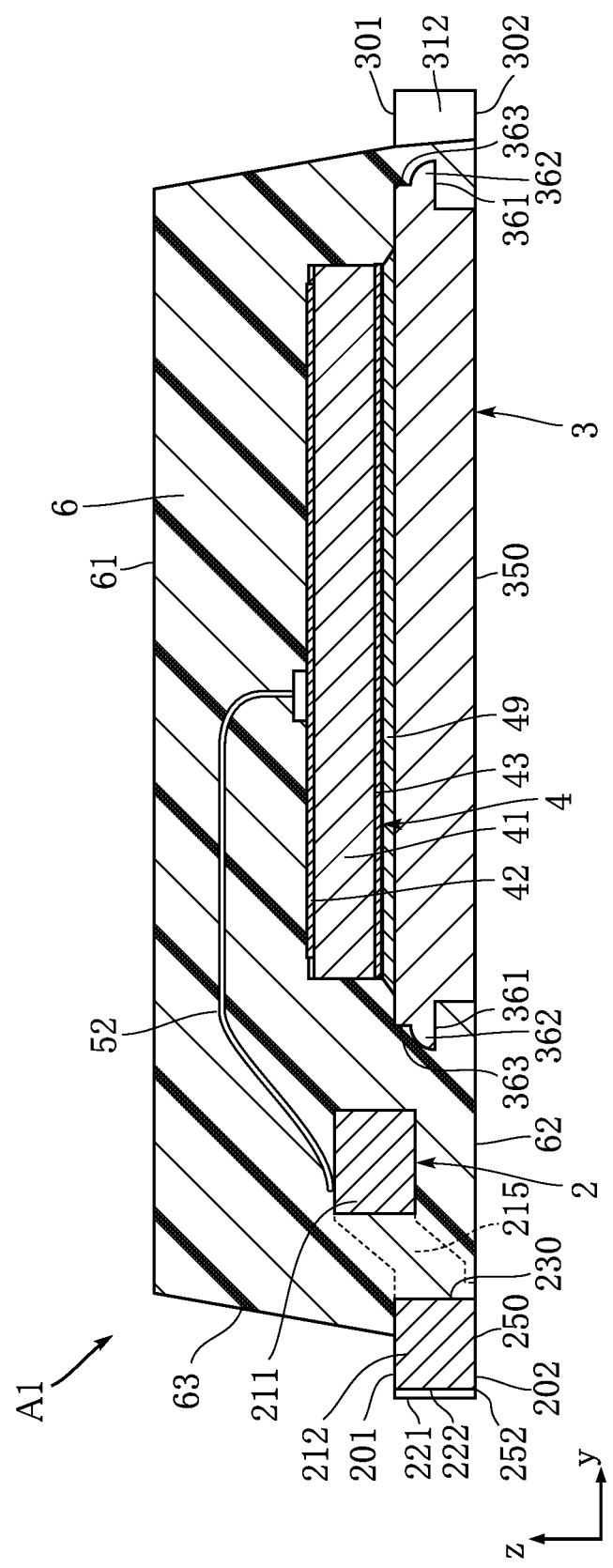
FIG. 10 is a sectional view taken along lines X-X in FIG. 3.
Figure 11:
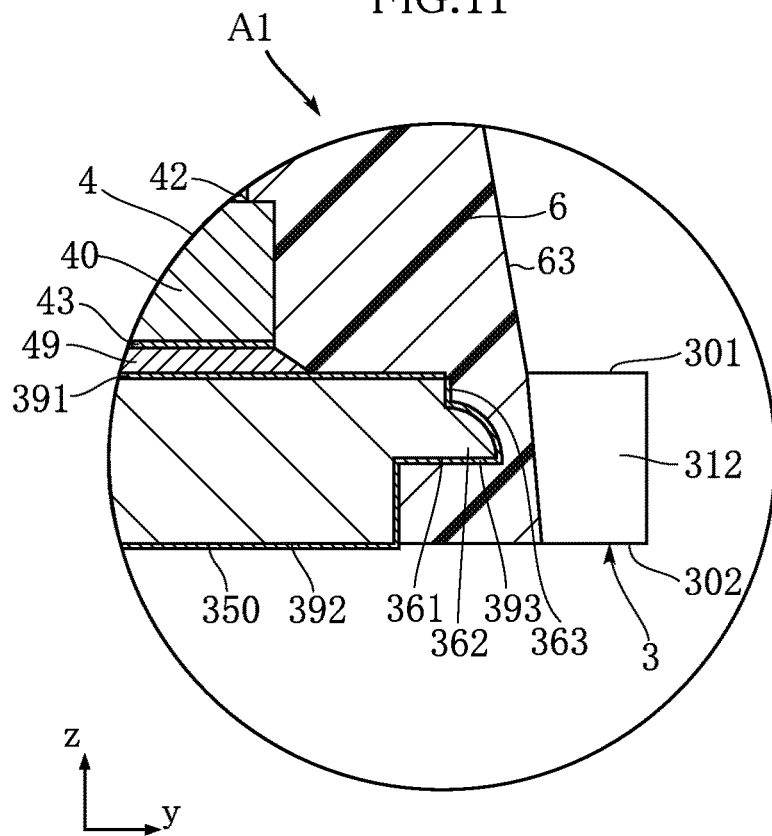
FIG. 11 is an enlarged sectional view of a main part, taken along lines X-X in FIG. 3.
Figure 12:
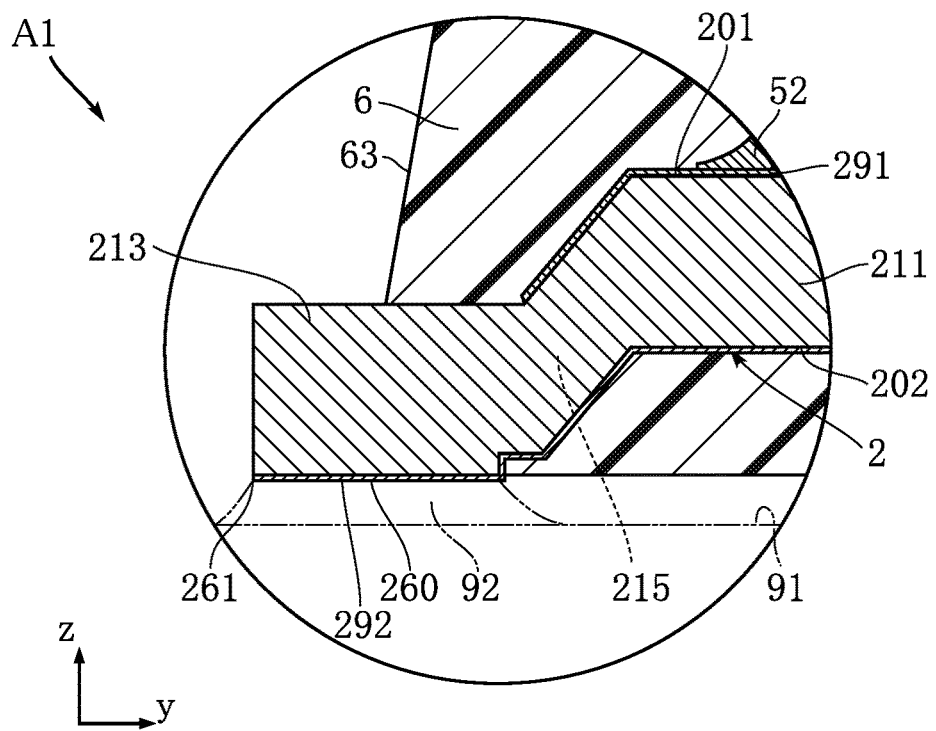
FIG. 12 is an enlarged sectional view of a main part, taken along lines XII-XII in FIG. 3.
Figure 13:
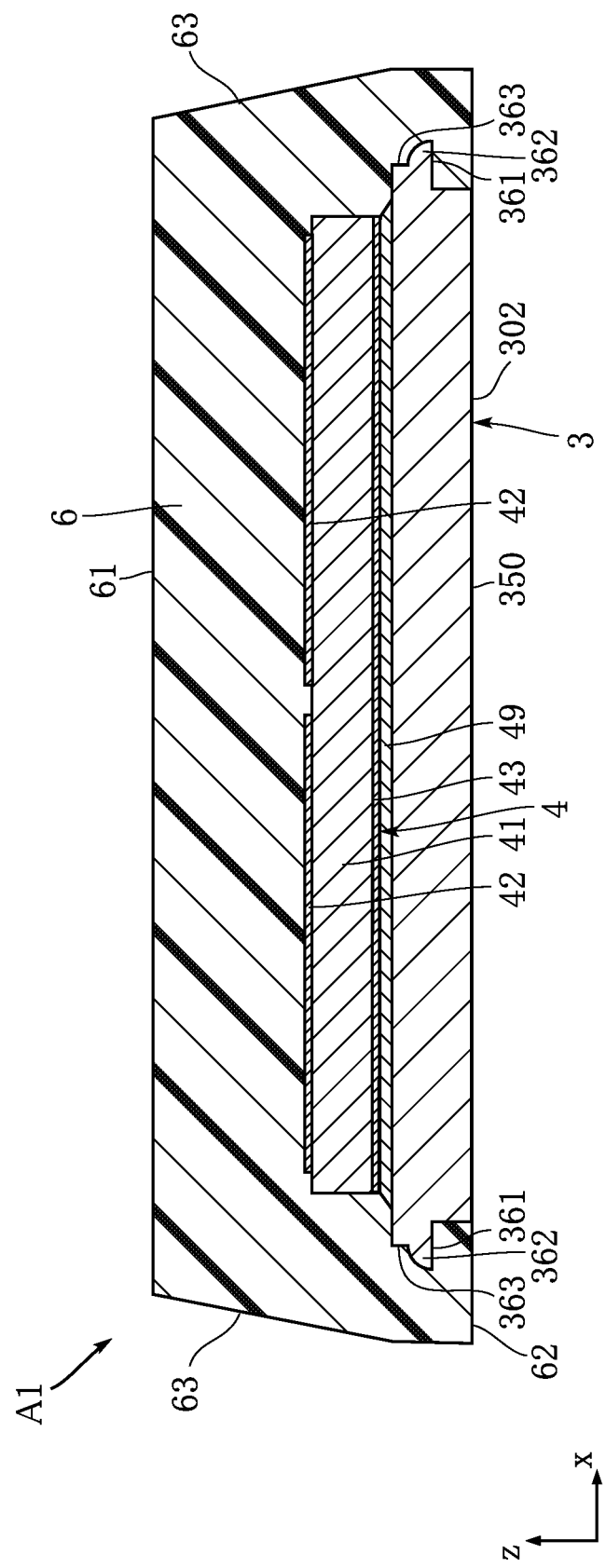
FIG. 13 is a sectional view taken along lines XIII-XIII in FIG. 3.

FIG. 1 is a plan view showing the semiconductor device A1. FIG. 2 is a bottom view showing the semiconductor device A1. FIG. 3 is a plan view of a main part of the semiconductor device A1. FIG. 4 is an enlarged plan view of a main part of the semiconductor device A1. FIG. 5 is an enlarged plan view of a main part of the semiconductor device A1. FIG. 6 is a sectional view taken along lines VI-VI in FIG. 3. FIG. 7 is an enlarged sectional view of a main part, taken along lines VI-VI in FIG. 3. FIG. 8 is a sectional view taken along lines VIII-VIII in FIG. 3. FIG. 9 is an enlarged sectional view of a main part, taken along lines VIII-VIII in FIG. 3. FIG. 10 is a sectional view taken along lines X-X in FIG. 3. FIG. 11 is an enlarged sectional view of a main part, taken along lines X-X in FIG. 3. FIG. 12 is an enlarged sectional view of a main part, taken along lines XII-XII in FIG. 3. FIG. 13 is a sectional view taken along lines XIII-XIII in FIG. 3. The y direction is a first direction in the present invention, the x direction is a second direction in the present invention, and the z direction is a thickness direction in the present invention.

The semiconductor device A1 is not limited in size. For example, in this embodiment, the semiconductor device A1 have dimensions of 2.6 to 3.6 mm in the direction x, 2.6 to 3.6 mm in the direction y and 0.7 to 1.0 mm in the direction z.

The plurality of leads 1, 2 and 3 are electrically connected to the semiconductor element 4, and at least one of them supports the semiconductor element 4. In the illustrated example, the semiconductor element 4 is mounted on the lead 3. In the description below, these leads are referred to as first lead 1, second lead 2 and third lead 3. The first lead 1, the second lead 2 and the third lead 3 may be formed by punching or bending a metal plate, for example. The first lead 1, the second lead 2, and the third lead 3 are made of metal, and preferably, made of Cu, Ni, alloys of Cu or Ni, or 42 alloy, for example. The first lead 1, the second lead 2 and the third lead 3 each may have a thickness of 0.1 to 0.3 mm, and has a thickness of about 0.2 mm in this embodiment.

As shown in FIG. 3, the first lead 1 and the second lead 2 are arranged side by side in the x direction. The third lead 3 is spaced apart from the first lead 1 and the second lead 2 in the y direction. As viewed in the z direction, the third lead 3 has the largest dimensions, and the first lead 1 has the smallest dimensions.

As shown in FIGS. 6 and 7, the first lead 1 has an obverse surface 101 and a reverse surface 102. The obverse surface 101 and the reverse surface 102 face away from each other in the z direction. As shown in FIGS. 4, 6 and 7, the first lead 1 has a first wire bonding portion 111, a first terminal portion 112 and a first bent portion 115. The first wire bonding portion 111 is at a position deviated from the first terminal portion 112 in the z direction toward a side which the obverse surface 101 faces. The first wire bonding portion 111 is positioned inward from the first terminal portion 112 in the y direction. In this embodiment, the positional deviation between the first wire bonding portion 111 and the first terminal portion 112 in the z direction is about 0.15 mm. The first bent portion 115 connects the first wire bonding portion 111 and the first terminal portion 112 to each other and has a bent shape as viewed in the x direction.

The first terminal portion 112 has two first end surfaces 121 and one first recessed end surface 122. The first end surfaces 121 face outward in they direction. The first recessed end surface 122 is recessed relative to the first end surfaces 121 in the y direction as viewed in the z direction. The first recessed end surface 122 is positioned between the two first end surfaces 121 in the x direction.

As shown in FIG. 2, the reverse surface of the first terminal portion 112, which is a part of the reverse surface 102, constitutes an outer reverse-surface mount portion 150.

As shown in FIG. 7, the outer reverse-surface mount portion 150 is exposed from the sealing resin 6. In mounting the semiconductor device A1 to a circuit board 91, the outer reverse-surface mount portion 150 is bonded to the circuit board 91 with solder 92. The outer reverse-surface mount portion 150 has end edges 151 adjoining the first end surfaces 121 and a recessed edge 152 adjoining the first recessed end surface 122.

As shown in FIGS. 4, 6 and 7, the first lead 1 has a first recessed side surface 123 and a first through-hole 130. The first recessed side surface 123 is recessed in the x direction as viewed in the z direction. The first recessed side surface 123 overlaps with (or has a boundary shared with) the first wire bonding portion 111 and the first bent portion 115, as viewed in the z direction. The first through-hole 130 penetrates the first lead 1 in the z direction. The first through-hole 130 overlaps with the first bent portion 115, as viewed in the z direction. The first through-hole 130 also overlaps with the first wire-bonding portion 111 and the first terminal portion 112, as viewed in the z direction.

The obverse surface 101 is partially covered with a first obverse-surface plating layer 191. For example, the first obverse-surface plating layer 191 is a Ag-plating layer. In this embodiment, the portion of the obverse surface 101 which constitutes the obverse surfaces of the first wire bonding portion 111 and the first bent portion 115 is covered with the first obverse-surface plating layer 191.

The reverse surface 102 is covered with a first reverse-surface plating layer 192. The first recessed end surface 122 is covered with a first side-surface plating layer 193. The two first end surfaces 121 are exposed without being covered with the first side-surface plating layer 193. The reverse-surface plating layer 192 and the first side-surface plating layer 193 are integrally formed of a same material. The first obverse-surface plating layer 191 is formed of a material different from that of the first reverse-surface plating layer 192 and first side-surface plating layer 193. For example, the reverse-surface plating layer 192 and the first side-surface plating layer 193 are a Sn-plating layer.

As shown in FIGS. 8, 9 and 12, the second lead 2 has an obverse surface 201 and a reverse surface 202. The obverse surface 201 and the reverse surface 202 face away from each other in the z direction. As shown in FIGS. 3, 5, 8, 9 and 12, the second lead 2 has a second wire-bonding portion 211, a second outer terminal portion 212, two second inner terminal portions 213 and three second bent portions 215. The second wire-bonding portion 211 is at a position deviated from the second outer terminal portion 212 and the second inner terminal portions 213 in the z direction toward a side which the obverse surface 201 faces. The second wire-bonding portion 211 is positioned inward from the second outer terminal portion 212 and the two second inner terminal portions 213 in the y direction. In this embodiment, the positional deviation between the second wire-bonding portion 211 and the second outer and inner terminal portions 212, 213 in the z direction is about 0.15 mm. Each of the three second bent portions 215 connects the second wire-bonding portion 211 to a corresponding one of the second outer and inner terminal portions 212, 213 and has a bent shape as viewed in the x direction. The second outer terminal portion 212 is at an outermost position in the x direction. The two second inner terminal portions 213 are positioned inward from the second outer terminal portion 212 in the x direction and aligned with the second outer terminal portion 212 in the x direction. The two second inner terminal portions 213 are positioned between the first terminal portion 112 and the second outer terminal portion 212 in the x direction.

The second outer terminal portion 212 has two second end surfaces 221 and one second recessed end surface 222. The second end surfaces 221 face outward in the y direction. The second recessed end surface 222 is recessed relative to the second end surfaces 221 in the y direction as viewed in the z direction. The second recessed end surface 222 is positioned between the two second end surfaces 221 in the x direction.

As shown in FIG. 2, the reverse surface of the second outer terminal portion 212, which is a part of the reverse surface 202, constitutes an outer reverse-surface mount portion 250. The outer reverse-surface mount portion 250 is exposed from the sealing resin 9. In mounting the semiconductor device A1 to a circuit board 91, the outer reverse-surface mount portion 250 is bonded to the circuit board 91 with solder 92, as shown in FIG. 9. The outer reverse-surface mount portion 250 has second end edges 251 adjoining the second end surfaces 221 and a second recessed edge 252 adjoining the second recessed end surface 222.

As shown in FIG. 2, the reverse surfaces of the second inner terminal portions 213, which are a part of the reverse surface 202, constitute two inner reverse-surface mount portions 260. The inner reverse-surface mount portions 260 are exposed from the sealing resin 6. In mounting the semiconductor device A1 to a circuit board 91, the inner reverse-surface mount portions 260 are bonded to the circuit board 91 with solder 92.

As shown in FIGS. 5, 8, 9 and 12, the second lead 2 has a second recessed side surface 223 and a second through-hole 230. The second recessed side surface 223 is recessed in the x direction as viewed in the z direction. The second recessed side surface 223 overlaps with the second wire-bonding portion 211 and the second bent portions 215, as viewed in the z direction. The second through-hole 230 penetrates the second lead 2 in the z direction. The second through-hole 230 overlaps with the second bent portions 215 as viewed in the z direction. The second through-hole 230 also overlaps with the second wire-bonding portion 211 and the second outer terminal portion 212, as viewed in the z direction.

As shown in FIG. 3, the obverse surface 201 is partially covered with a second obverse-surface plating layer 291. For example, the second obverse-surface plating layer 291 is a Ag-plating layer. In this embodiment, the portion of the obverse surface 201 which constitutes the obverse surfaces of the second wire-bonding portion 211 and the second bent portions 215 is covered with the second obverse-surface plating layer 291.

As shown in FIGS. 9 and 12, the reverse surface 202 is covered with a second reverse-surface plating layer 292. The second recessed end surface 222 is covered with a second side-surface plating layer 293. The two second end surfaces 221 are exposed without being covered with the second side-surface plating layer 293. Also, the end surfaces of the inner reverse-surface mount portions 260 are exposed without being covered with the second side-surface plating layer 293. The second reverse-surface plating layer 292 and the second side-surface plating layer 293 are integrally formed of a same material. The second obverse-surface plating layer 291 is formed of a material different from that of the second reverse-surface plating layer 292 and second side-surface plating layer 293. For example, the second reverse-surface plating layer 292 and the second side-surface plating layer 293 are a Sn-plating layer.

As shown in FIG. 2, the outer reverse-surface mount portion 150 and the outer reverse-surface mount portion 250 are arranged at outermost positions on the opposite sides in the x direction, with the two inner reverse-surface mount portions 260 arranged between the outer reverse-surface mount portions 150 and 250.

Examples of the dimensions and areas of the outer reverse-surface mount portion 150, the outer reverse-surface mount portion 250 and the inner reverse-surface mount portions 260 are described below.

Referring to FIG. 2, the dimension L1 in the x direction of the outer reverse-surface mount portions 150, 250 is about 0.7 mm. The dimension L2 in the x direction of the inner reverse-surface mount portions 260 is about 0.3 mm. The distance S1 between the outer reverse-surface mount portion 150 and the adjacent inner reverse-surface mount portion 260 is equal to the distance S1 between the outer reverse-surface mount portion 250 and the adjacent inner reverse-surface mount portion 260. In this example, the distance S1 is 0.27 mm. The distance S2 between the two inner reverse-surface mount portions 260 is 0.27 mm, which is equal to the distance S1. In the illustrated example, the dimensional ratio R2 of the dimension L1 to the dimension L2 is 2.33. It is preferable that the dimensional ratio R2 is in a range of 1.7 to 2.5. In this embodiment, all of the outer reverse-surface mount portion 150, the outer reverse-surface mount portion 250 and the two inner reverse-surface mount portions 260 are equal in dimension in the y direction. The outer reverse-surface mount portion 150 and the outer reverse-surface mount portion 250 are generally in the form of a rectangle elongated in the x direction. Each of the two inner reverse-surface mount portions 260 is in the form of a rectangle that is less elongated than the outer reverse-surface mount portions 150 and 250.

The outer reverse-surface mount portion 150 and the outer reverse-surface mount portion 250 have the same area E1, which is 0.222 mm$^2$ in the illustrated example. The area E2 of each of the inner reverse-surface mount portions 260 is 0.096 mm$^2$. In the illustrated example, the area ratio R1 of the area E1 to the area E2 is 2.31. It is preferable that the area ratio R1 is in a range of 1.7 to 2.5.

The ratio R3 of the dimensional ratio R2 to the area ratio R1 is 1.01. It is preferable that the ratio R3 is in a range of 0.68 to 1.47.

As shown in FIGS. 10 and 11, the third lead 3 has an obverse surface 301 and a reverse surface 302. As shown in FIG. 10, the obverse surface 301 and the reverse surface 302 face away from each other in the z direction. The third lead 3 includes an element bonding portion 311, a plurality of terminal extensions 312, and two side extensions 313. For example, the element bonding portion 311 is rectangular as viewed in the z direction. The semiconductor element 4 is mounted on the element bonding portion 311. The plurality of terminal extensions 312 extend from the element bonding portion 311 in the y direction and are arranged side by side in the x direction. The two side extensions 313 extend from the element bonding portion 311 toward the opposite sides in the x direction.

As shown in FIG. 2, the portion of the reverse surface 302 which is exposed from the sealing resin 6 constitutes element-side reverse-surface mount portion 350. In this embodiment, the entirety of the reverse surface 302 constitutes the element-side reverse-surface mount portion 350. In mounting the semiconductor device A1 to a circuit board 91, the element-side reverse-surface mount portion 350 is bonded to the circuit board 91 with solder 92.

As shown in FIGS. 10 and 11, the third lead 3 includes a reverse-side retreated portion 361, an eave portion 362, and an obverse-side intermediate end surface 363.

The reverse-side retreated portion 361 is retreated from the reverse surface 302 at an edge of the third lead 3 as viewed in the z direction. The eave portion 362 is connected to the reverse-side retreated portion 361 on the obverse surface 301 side in the z direction and projects outward as viewed in the z direction. The obverse-side intermediate end surface 363 connects the obverse surface 301 to the eave portion 362 and is positioned inward from the eave portion 362 as viewed in the z direction. The obverse-side intermediate end surface 363 overlaps with the reverse-side retreated portion 361 as viewed in the thickness direction.

In this embodiment, the reverse-side retreated portion 361, the eave portion 362, and the obverse-side intermediate end surface 363 are provided at an edge of the third lead 3 which is closer to the first and the second leads 1 and 2 as viewed in the z direction, and at opposite edges of the third lead 3 in the x direction, and at an edge of the third lead 3 which is opposite to the leads 1, 2 between the terminal extensions 312.

As shown in FIG. 3, the third lead 3 has a plurality of obverse-side recesses 371. The obverse-side recesses 371 are provided at positions avoiding the semiconductor element 4 as viewed in the z direction. The obverse-side recesses 371 are recessed from the obverse surface 301 in the thickness direction. In this embodiment, the obverse-side recesses 371 are provided at respective root portions of the terminal extensions 312 and two side extensions 313.

As shown in FIG. 11, the obverse surface 301 of the third lead 3 is covered with a third obverse-surface plating layer 391. Specifically, in the illustrated example, the third obverse-surface plating layer 391 covers the obverse surface 301 except the obverse surfaces of the terminal extensions 312. For example, the third obverse-surface plating layer 391 is a Ag-plating layer.

The reverse surface 302 is covered with a third reverse-surface plating layer 392. The side surface of the third lead 3 is covered with a third side-surface plating layer 393 except the end surfaces of the terminal extensions 312 and the end surfaces of the two side extensions 313. The third reverse-surface plating layer 392 and the third side-surface plating layer 393 are integrally formed of a same material. The third obverse-surface plating layer 391 is formed of a material different from that of the third reverse-surface plating layer 392 and third side-surface plating layer 393. For example, the third reverse-surface plating layer 392 and the third side-surface plating layer 393 are a Sn-plating layer.

The semiconductor element 4 is an element that performs electrical functions of the semiconductor device A1. The type of semiconductor element 4 is not particularly limited. As shown in FIGS. 3 and 6, in this embodiment, the semiconductor element 4 is configured as a transistor. The semiconductor element 4 includes an element body 40, a first electrode 41, a second electrode 42 and a third electrode 43.

The first electrode 41 and the second electrode 42 are arranged on the obverse surface of the element body 40. The third electrode 43 is arranged on the reverse surface of the element body 40. In this embodiment, the first electrode 41 is a gate electrode, the second electrode 42 is a source electrode, and the third electrode 43 is a drain electrode.

The semiconductor device A1 has a first wire 51 and a plurality of second wires 52. The first wire 51 is connected to the first electrode 41 and the first wire-bonding portion 111 of the first lead 1. The second wires 52 are connected to the second electrode 42 and the second wire-bonding portion 211 of the second lead 2.

The third electrode 43 is mounted to the element bonding portion 311 of the third lead 3 via a conductive bonding material 49. Specifically, the third electrode 43 is bonded to the third obverse-surface plating layer 391 on the obverse surface 301 of the element bonding portion 311 with the conductive bonding material 49.

The sealing resin 6 covers the semiconductor element 4, the first wire 51, the second wires 52 and a part of each of the first lead 1, the second lead 2 and the third lead 3. For example, the sealing resin 6 is made of a black epoxy resin.

As shown in FIGS. 1, 2 and 6, the sealing resin 6 has a sealing-resin obverse surface 61, a sealing-resin reverse surface 62 and a sealing-resin side surface 63. The sealing-resin obverse surface 61 and the sealing-resin reverse surface 62 face away from each other in the z direction. The sealing-resin obverse surface 61 faces the same side as the obverse surfaces 101, 201 and 301. The sealing-resin reverse surface 62 faces the same side as the reverse surfaces 102, 202 and 302. The sealing-resin side surface 63 is connected to the sealing-resin obverse surface 61 and the sealing-resin reverse surface 62 and slightly inclined with respect to the z direction.

All of the outer reverse-surface mount portions 150 and 250, the two inner reverse-surface mount portions 260 and the element-side reverse-surface mount portion 350 are exposed from the sealing resin 6. The outer reverse-surface mount portions 150 and 250, the two inner reverse-surface mount portions 260 and the element-side reverse-surface mount portion 350 are flush with the sealing-resin reverse surface 62 of the sealing resin 6.

Figure 14:
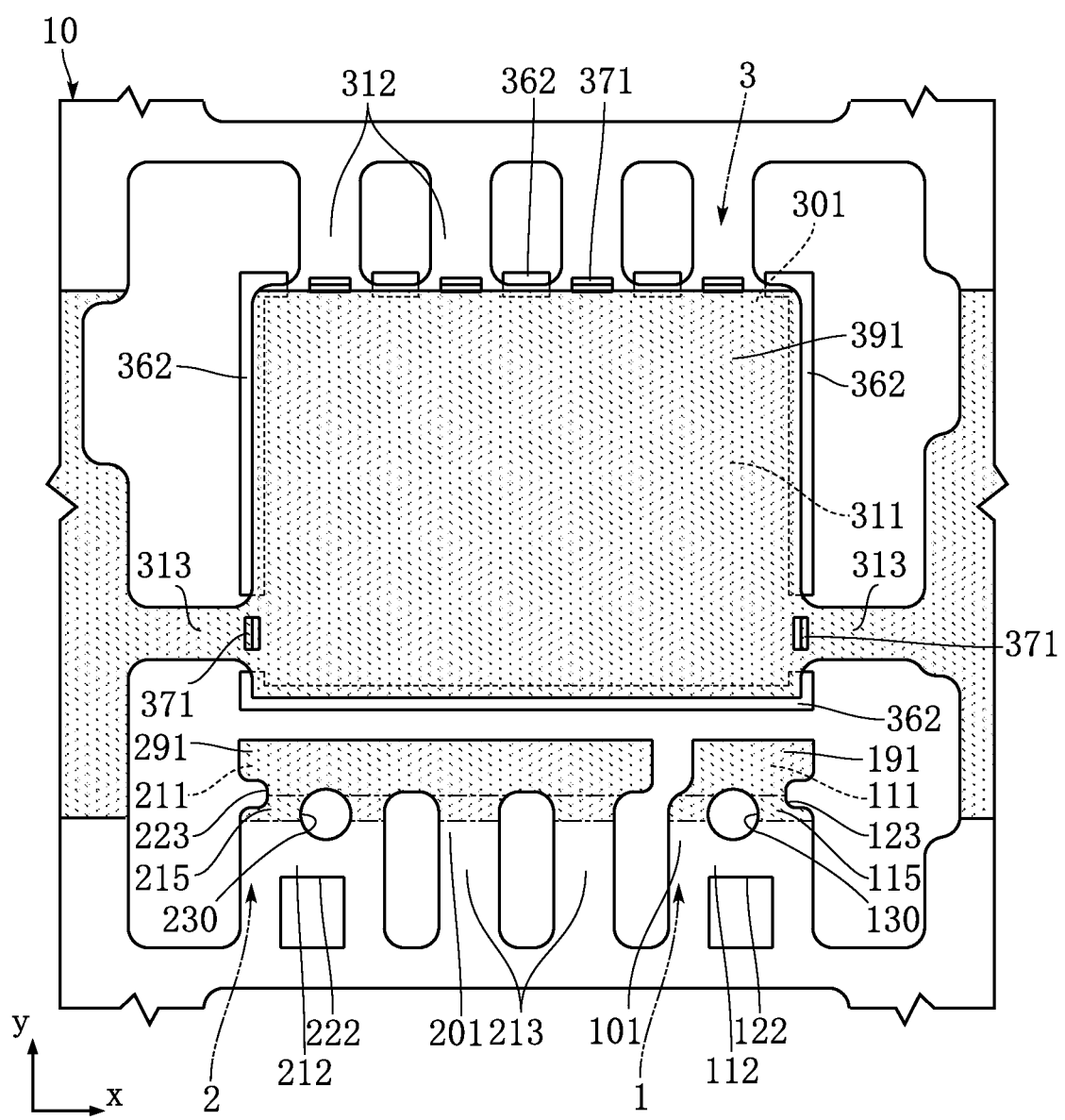
FIG. 14 is a schematic plan view showing a step in manufacturing the semiconductor device according to the first embodiment of the present invention.

FIG. 14 shows a lead frame 10 used for making the semiconductor device A1. The lead frame 10 is a metal plate including portions to become the first lead 1, the second lead 2 and the third lead 3.

The portions of the lead frame 10 which are to become the obverse surfaces 101, 201 and 301 are provided with a Ag-plating layer, which is to become the first obverse-surface plating layer 191, the second obverse-surface plating layer 291 and the third obverse-surface plating layer 391. The portions of the lead frame 10 which are to become the reverse surfaces 102, 202 and 302 are provided with a Sn-plating layer, which is to become the first reverse-surface plating layer 192, the second reverse-surface plating layer 292 and the third reverse-surface plating layer 392. The side surface of the lead frame 10 along the z direction is provided with a Sn plating layer, which is to become the first side-surface plating layer 193, the second side-surface plating layer 293 and the third side-surface plating layer 393.

Figure 15:
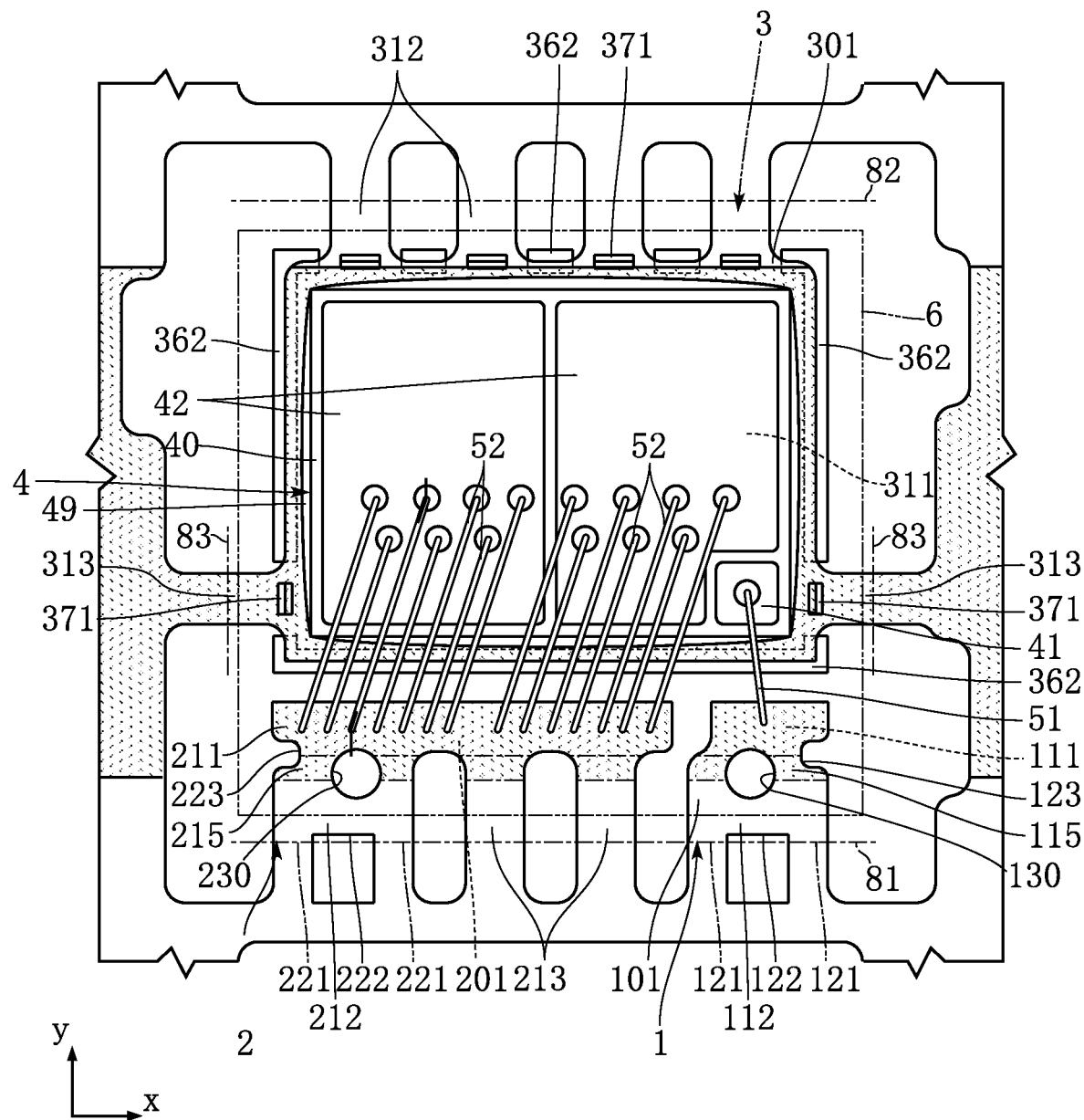
FIG. 15 is a schematic plan view showing a step in manufacturing the semiconductor device according to the first embodiment of the present invention.

As shown in FIG. 15, the semiconductor element 4 is mounted on the lead frame 10. Then, the first wire 51 and the second wires 52 are bonded. Then, the sealing resin 6 is formed. Then, the lead frame 10 is cut along the cutting lines 81, 82 and 83. This cutting operation provides the first end surfaces 121 of the first terminal portion 112, the second end surfaces 221 of the second outer terminal portion 212, the end surfaces of the terminal extensions 312 and the end surfaces of the side extensions 313. These surfaces are not provided with the first side-surface plating layer 193, the second side-surface plating layer 293 or the third side-surface plating layer 393.

The advantages of the semiconductor device A1 are described below.

According to this embodiment, the outer reverse-surface mount portions 150 and 250 positioned at the outermost positions in the x direction have a larger area than the inner reverse-surface mount portions 260 located at inner positions in the x direction. According to a study by the inventors, a durability test in which the semiconductor device A1 mounted to a circuit board 91 or the like with solder 92 is alternately subjected to a high temperature state and a low temperature state showed that a large stress is generated in the solder 92 located at the outermost positions in the x direction. With the semiconductor device A1, the outer reverse-surface mount portions 150 and 250, which are located at the outermost positions, have a relatively large area, whereby cracking or the like due to such a large stress is prevented. Thus, the semiconductor device A1 has enhanced mounting strength.

In the semiconductor device A1, the outer reverse-surface mount portion 150 and the outer reverse-surface mount portion 250 are provided at opposite ends in the x direction. This prevents cracking of the solder 92 in a balanced manner at opposite ends in the x direction.

Figure 16:
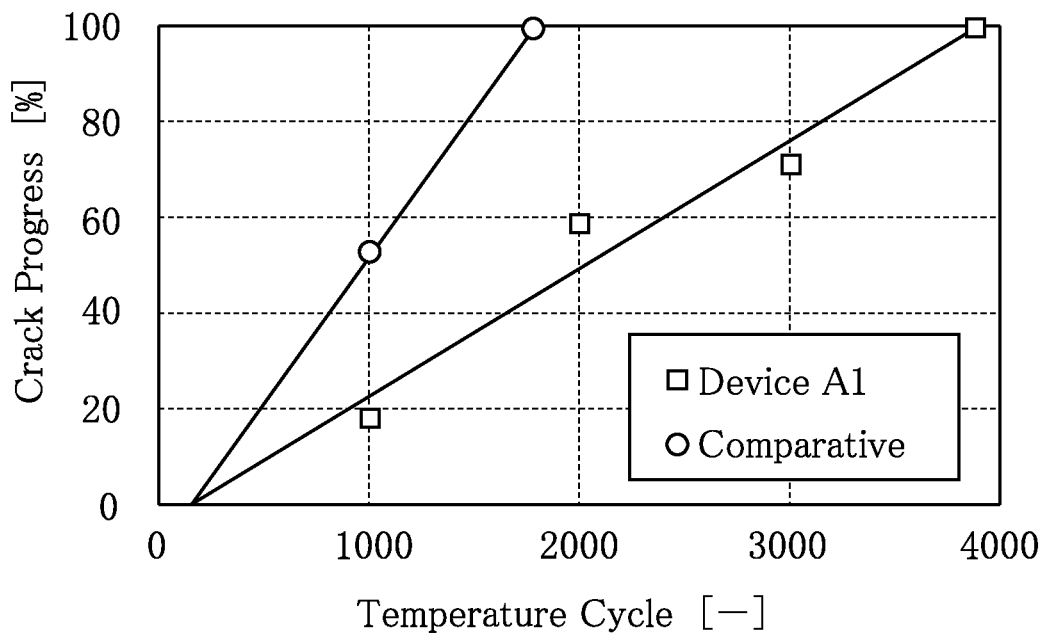
FIG. 16 is a graph showing the results of a crack progress test performed on the semiconductor device of the first embodiment and another semiconductor device as a comparative example.

FIG. 16 shows the results of a crack progress test performed on the semiconductor device A1 and another semiconductor device as a comparative example. In this test, the semiconductor devices mounted to a circuit board were repetitively subjected to a temperature change cycle between a low temperature (−55 degrees Celsius) and a high temperature (150 degrees Celsius), and the progress of cracking at the solder was examined. The horizontal axis represents the number of the temperature change cycles, whereas the vertical axis represents the degree of crack progress, where the crack causing complete release of the solder is defined as 100%. As the comparative example, use was made of a semiconductor device having a plurality of reverse-surface mount portions which were similar in structure to the inner reverse-surface mount portions 260 and equal in size to each other. In other words, the area ratio R1 of the comparative example was 1.0. As shown in the figure, the crack progress of the comparative example was 53% after 1000 cycles and reached 100% after 1765 cycles. On the other hand, for the outer reverse-surface mount portions 150 and 250 of the semiconductor device A1, the crack progress was only 18% after 1000 cycles and 59% after 2000 cycles. The crack progress reached 100% after 3900 cycles. In this way, the semiconductor device A1 significantly suppresses the progress of solder cracking, as compared to the comparative example. It is desirable that the crack progress reaches 100% after at least 3000 cycles, which is found to be achievable when the area ratio R1 is 1.7. When the area ratio R1 or the dimensional ratio R2 exceeds 2.5, the outer reverse-surface mount portions 150 and 250 occupy an excessively large area of the semiconductor device A1, which is not desirable for proper layout of the reverse-surface mount portions.

Thus, it is desirable that the area ratio R1 of the outer reverse-surface mount portion 150 or 250 to the inner reverse-surface mount portions 260 is in a range of 1.7 to 2.5. With such a ratio, cracking of solder 92 is reliably prevented while an increase in size of the semiconductor device A1 due to an excessively large size of the outer reverse-surface mount portions 150 and 250 is avoided.

The area ratio R1 in the above-described range is realized when the dimensional ratio R2 of the dimension in the x direction of the outer reverse-surface mount portion 150 or 250 to the dimension in the x direction of the inner reverse-surface mount portions 260 is in a range of 1.7 to 2.5. With the dimensional ratio R2 in such a range, the dimensions in the y direction of the outer reverse-surface mount portions 150 and 250 are prevented from becoming too large. In this embodiment, the outer reverse-surface mount portions 150 and 250 are equal in dimension in the y direction to the inner reverse-surface mount portions 260 and do not project in the y direction relative to the inner reverse-surface mount portions 260.

To achieve the area ratio R1 and the dimensional ratio R2 in the above-described range, it is desirable that the ratio R3 of the dimensional ratio R2 to the area ratio R1 is in a range of 0.68 to 1.47.

As described above, the first terminal portion 112 has two first end surfaces 121 and one first recessed end surface 122, as shown in FIGS. 4 and 7. The first end surfaces 121 are provided by the cutting process described with reference to FIG. 15, and the lead 1 is exposed at the first end surfaces 12. On the other hand, the first recessed end surface 122 is covered with the first side-surface plating layer 193. The first side-surface plating layer 193, which may be a Sn-plating layer, has a higher wettability to the solder 92 than the first lead 1 has. Thus, in bonding the outer reverse-surface mount portion 150 to the circuit board 91 with solder 92, the solder 92 covers the first side-surface plating layer 193 (first recessed end surface 122) as well. This further enhances the mounting strength. The first side-surface plating layer 193 is integral with and formed of a same material as the first reverse-surface plating layer 192. This allows the solder 92 to integrally adhere to the outer reverse-surface mount portion 150 (first reverse-surface plating layer 192) and the first recessed end surface 122 (first side-surface plating layer 193). This is favorable for enhancing the mounting strength.

As described above, the second outer terminal portion 212 has two second end surfaces 221 and one second recessed end surface 222, as shown in FIGS. 5 and 9. The second end surfaces 221 are provided by the cutting process described with reference to FIG. 15, and the second lead 2 is exposed at the second end surfaces 221. On the other hand, the second recessed end surface 222 is covered with the second side-surface plating layer 293. The second side-surface plating layer 293, which may be a Sn-plating layer, has a higher wettability to the solder 92 than the second lead 2 has. Thus, in bonding the outer reverse-surface mount portion 250 to the circuit board 91 with solder 92, the solder 92 covers the second side-surface plating layer 293 (second recessed end surface 222) as well. This further enhances the mounting strength. The second side-surface plating layer 293 is integral with and formed of a same material as the second reverse-surface plating layer 292. This allows the solder 92 to integrally adhere to the outer reverse-surface mount portion 250 (second reverse-surface plating layer 292) and the second recessed end surface 222 (second side-surface plating layer 293). This is favorable for enhancing the mounting strength.

A larger current flows through the second electrode 42, which is a source electrode, than through the first electrode 41, which is agate electrode. The second lead 2, through which a large current flows, is provided with the second outer terminal portion 212 and the two second inner terminal portions 213, which is favorable for reducing the resistance.

The provision of the first recessed side surface 123 and the first through-hole 130 enhance the bonding strength between the first lead 1 and the sealing resin 6. The provision of the second recessed side surface 223 and the second through-hole 230 enhances the bonding strength between the second lead 2 and the sealing resin 6. The provision of the reverse-side retreated portion 361, the eave portion 362, the obverse-side intermediate end surface 363 and the obverse-side recesses 371 enhances the bonding strength between the third lead 3 and the sealing resin 6.

Figure 17:
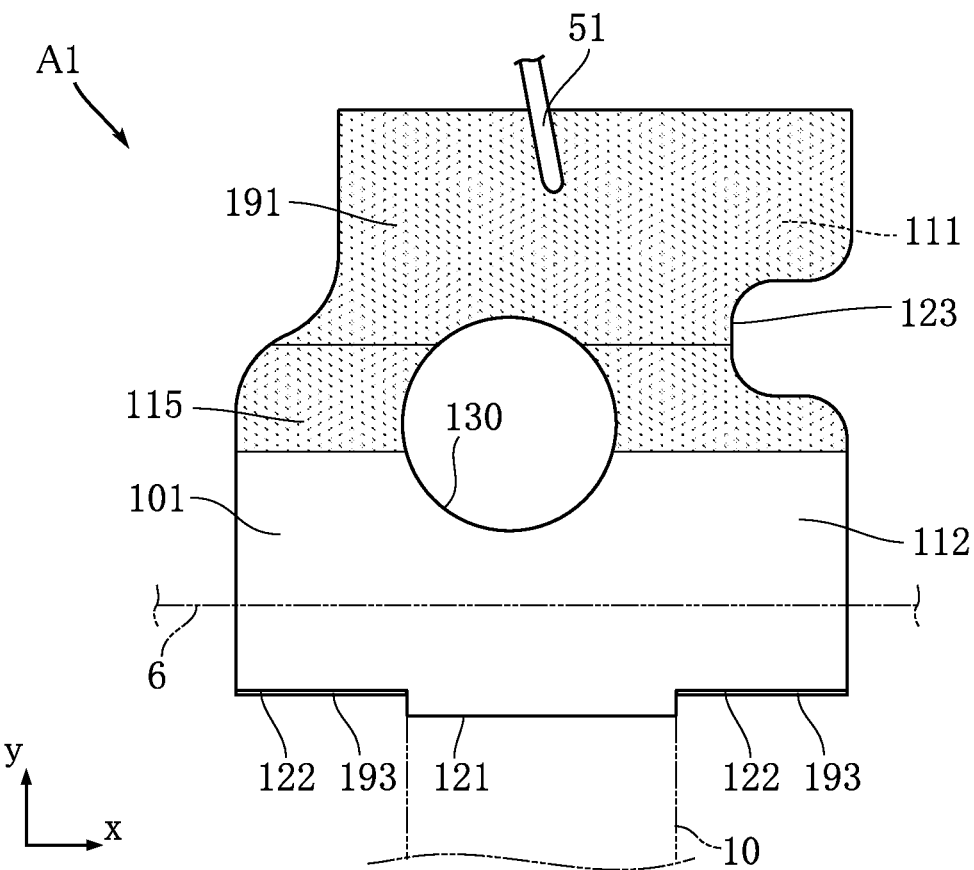
FIG. 17 is a plan view showing a main part of a variation of the semiconductor device according to the first embodiment of the present invention.
Figure 18:
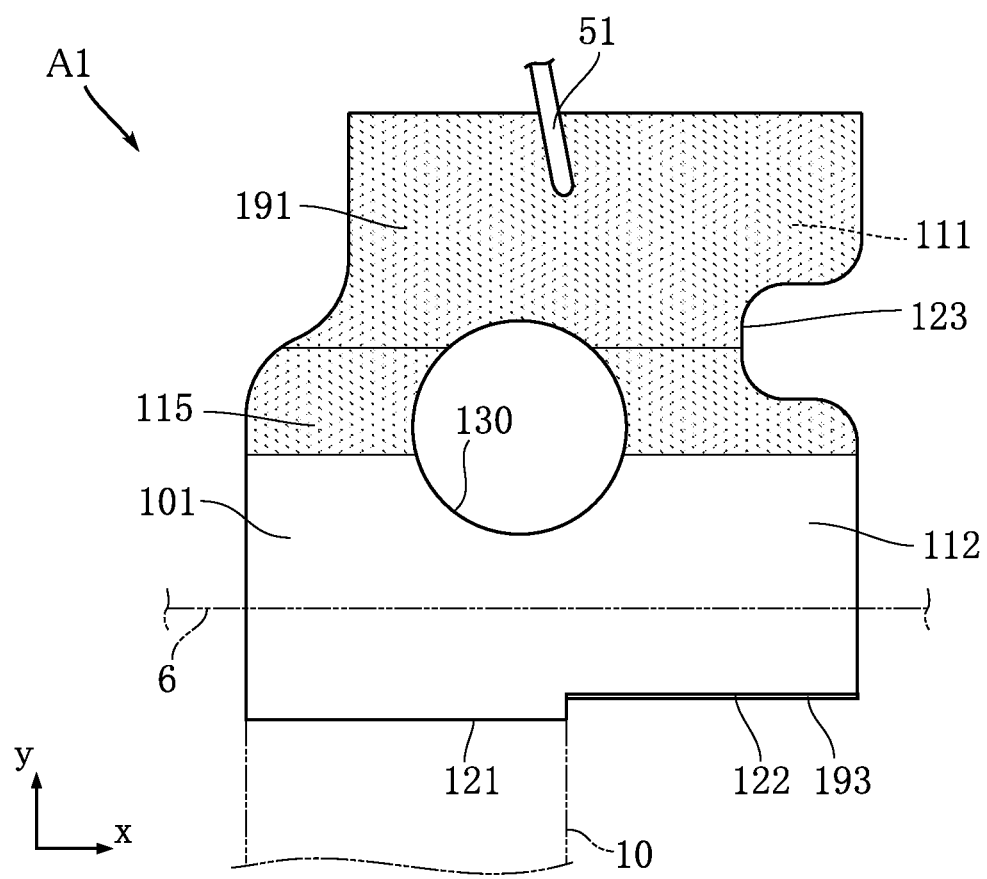
FIG. 18 is a plan view showing a main part of another variation of the semiconductor device according to the first embodiment of the present invention.

FIGS. 17 and 18 show variations of the semiconductor device A1. In these figures, the elements that are identical or similar to those of the above example are designated by the same reference signs as those used for the above example.

In the variation shown in FIG. 17, the first terminal portion 112 has one first end surface 121 and two first recessed end surfaces 122. The first end surfaces 121 is positioned between the two first recessed end surface 122 in the x direction. The first terminal portion 112 having such a configuration is formed by using a lead frame 10 indicated by imaginary lines in the figure. In this variation again, the two first recessed end surfaces 122 are covered with the first side-surface plating layer 193. Thus, this variation also enhances the bonding strength of the semiconductor device A1.

In the variation shown in FIG. 18, the first terminal portion 112 has one first end surface 121 and one first recessed end surface 122. The first end surface 121 and the first recessed end surface 122 are arranged side by side in the x direction. The first terminal portion 112 having such a configuration is formed by using a lead frame 10 indicated by imaginary lines in the figure. In this variation again, the first recessed end surface 122 is covered with the first side-surface plating layer 193. Thus, this variation also enhances the bonding strength of the semiconductor device A1.

It is to be noted that the configurations of the variations shown in FIGS. 17 and 18 are also applicable to the second end surfaces 221 and the second recessed end surface 222 of the second wire-bonding portion 211 of the second lead 2.

The semiconductor device according to the present invention is not limited to the embodiments described above. Various design changes can be made to the specific configurations of the elements of the semiconductor device according to the present invention.

The invention claimed is:

1. A semiconductor device comprising:
   a first lead;
   a semiconductor element spaced apart from the first lead in a first direction in plan view and electrically connected to the first lead;
   a second lead on which the semiconductor element is provided; and
   a sealing resin covering the semiconductor element and a part of the first lead,
   wherein the sealing resin comprises a first resin side surface extending in a second direction perpendicular to the first direction in plan view,
   the first lead comprises a protrusion and an inner portion, the protrusion projecting out from the resin side surface in the first direction, the inner portion being embedded within the sealing resin,
   the inner portion of the first lead comprises a wire bonding part and a bent part, the bent part connecting the protrusion and the wire bonding part to each other, and
   the second lead is formed with an eave portion extending toward the first lead in the first direction, the eave portion including a curved surface at an upper side of the eave portion, the eave portion being formed in an area between an upper surface of the second lead and a lower surface of the second lead, and
   the first lead comprises a recessed end surface.

2. The semiconductor device according to claim 1, wherein the eave portion includes a flat surface at a lower side of the eave portion.

3. The semiconductor device according to claim 2, wherein the flat surface of the eave portion has a greater length in the first direction than the curved surface of the eave portion.

4. The semiconductor device according to claim 3, wherein the upper surface of the second lead is formed with a recess, and the semiconductor element is disposed between the recess and the eave portion in plan view.

5. The semiconductor device according to claim 4, wherein part of the sealing resin is disposed within the recess, and the sealing resin covers the flat surface of the eave portion.

6. The semiconductor device according to claim 5, further comprising a third lead disposed next to the first lead, wherein the third lead is electrically connected to a gate electrode of the semiconductor element.

7. The semiconductor device according to claim 6, wherein the resin side surface is inclined with respect to the first direction.

8. The semiconductor device according to claim 7, wherein the second lead includes a partially widened portion that is greater in length in the second direction than an adjacent portion of the second lead.

9. The semiconductor device according to claim 8, wherein at least a part of the wire bonding part of the inner portion of the first lead is disposed higher than the upper surface of the second lead.

10. The semiconductor device according to claim 9, wherein the first lead comprises two end face portions flanking the recessed end surface, each of the end face portions being not flush with the recessed end surface.

11. The semiconductor device according to claim 10, wherein each of the two end face portions is smaller in size along the second direction than the recessed end surface.

12. The semiconductor device according to claim 2, wherein the wire bonding part of the first lead comprises an upper surface and a lower surface that is higher than the flat surface of the eave portion.

13. The semiconductor device according to claim 1, wherein the sealing resin comprises a lower surface, an upper surface and a plurality of side surfaces including said resin side surface, the plurality of side surfaces as a whole tapering from the lower surface of the sealing resin toward the upper surface of the sealing resin.

14. The semiconductor device according to claim 13, wherein the lower surface of the second lead is exposed from the lower surface of the sealing resin.

15. The semiconductor device according to claim 1, wherein the upper surface of the second lead comprises a region exposed from the sealing resin.

16. The semiconductor device according to claim 1, wherein the bent part of the first lead comprises an upper inclined surface that is smaller in inclination angle relative to the first direction than the resin side surface of the sealing resin.

17. The semiconductor device according to claim 1, wherein the second lead comprises a flat end portion that is disposed above the eave portion and arranged to face the wire bonding part of the first lead via part of the sealing resin.

18. The semiconductor device according to claim 1, wherein the sealing resin comprises a second resin side surface opposite to the first resin side surface in the first direction, the eave portion being disposed closer to the first resin side surface than to the second resin side surface in the first direction.

19. The semiconductor device according to claim 1, wherein the eave portion is elongated in the second direction and greater in length in the second direction than the first lead.

20. The semiconductor device according to claim 1, wherein the eave portion is elongated in the second direction and greater in length in the second direction than the semiconductor element,
 the semiconductor device further comprising a wire electrically connecting the semiconductor element and the wire bonding part of the first lead to each other, an entirety of the wire is embedded in the sealing resin.

* * * * *